US006027850A

United States Patent [19]

Kawakami et al.

[11] Patent Number: 6,027,850

[45] Date of Patent: Feb. 22, 2000

[54] THERMAL TRANSFER IMAGE FORMING METHOD USING LASER

[75] Inventors: Sota Kawakami; Katsumi Maejima, both of Hino, Japan

[73] Assignee: Konica Corporation, Japan

[21] Appl. No.: 09/218,401

[22] Filed: Dec. 22, 1998

[30] Foreign Application Priority Data

Dec. 25, 1997 [JP] Japan .................................... 9-357171

[51] Int. Cl.[7] ................................ G03F 7/24; G03F 7/34; B65H 29/32; G01D 15/24; G03B 27/60

[52] U.S. Cl. .......................... 430/201; 430/200; 430/207; 271/196; 271/276; 346/138; 347/197; 347/262; 355/73

[58] Field of Search .................................... 430/200, 201, 430/207; 355/73; 346/138; 347/197, 262; 271/196, 276

[56] References Cited

U.S. PATENT DOCUMENTS

| | | | |
|---|---|---|---|
| 5,376,954 | 12/1994 | Kerr | 355/73 |
| 5,501,937 | 3/1996 | Matsumoto et al. | 430/201 |
| 5,580,693 | 12/1996 | Nakajima et al. | 430/200 |
| 5,821,028 | 10/1998 | Maejima et al. | 430/201 |
| 5,909,237 | 6/1999 | Kerr et al. | 346/138 |

*Primary Examiner*—Richard L. Schilling
*Attorney, Agent, or Firm*—Jordan B. Bierman; Bierman, Muserlian and Lucas

[57] ABSTRACT

A thermal transfer image forming method using a laser is disclosed. The method is comprises the steps of placing an image-receiving sheet comprising a substratum and an image receiving layer, on a supporting drum having suction holes to be held thereon so that the surface of the image-receiving layer is faced outside, superposing an ink sheet comprising a substratum and an ink layer, on the image-receiving sheet held on the supporting drum so that the surface of the image receiving-layer contacts with the surface of the ink layer, imagewise irradiation laser light beam to the ink sheet held on the supporting drum which is rotated to transfer an image onto the surface of the image receiving layer, wherein during imagewise irradiation, the image-receiving sheet and the ink sheet are sucked through the suction holes of the supporting drum to be held thereon, the size of the ink sheet is larger than that of the image receiving sheet in both of longitudinal and lateral directions, the diameters of not less than 95% in number of the suction holes provided in an area covered by the image-receiving sheet are each within a range of from 0.4 mm to 2.5 mm, the opening ratio of the suction holes in the area covered by the image-receiving sheet is not less than 0.1%, the degree of the reduced pressure in the inside of the supporting drum is within a range of from 150 torr to 640 torr, the circumferential length of the supporting drum is not less than 600 mm, and the thickness of the image-receiving sheet is within a range of from 50 $\mu$m to 170 $\mu$m.

7 Claims, 5 Drawing Sheets

THERMAL TRANSFER IMAGE FORMING METHOD USING LASER

FIELD OF THE INVENTION

The present invention relates to a laser thermal transfer image forming method which is suitable for making a color proof by the use of an electronic signal input, and more particularly, to a laser thermal transfer image forming method by thermal energy is imagewise given by a laser to a series of ink sheets to transfer ink onto an image-receiving sheet selectively, and to automatically form a full color proof image.

BACKGROUND OF THE INVENTION

In recent years, there has extensively been developed an electronic system for generating a plate from electronic data stored in an appropriate data recording device, in the form of separation of a single color separated electronically, and there have been developed to be put in practice various processes to form electronically both a proof image and an actual plate, to make them to be stored and to process. Though some of these electronic systems can handle analog images, there are used digital images because they can be processed easily. Prior to complete judgment to decide whether final printing can be started or not, it is usually necessary to make a hard copy. Therefore, there is required a method to employ an output apparatus or a printer of a certain type which forms a hard copy or a proof image for the purpose of estimating finish of an actual printing.

Incidentally, Japanese Patent Publication Open to Public Inspection (JP O.P.I.) No. 5-221067 discloses an apparatus for forming proof images having a high image quality constantly, rapidly and accurately by means of a thermal transfer process In this thermal imaging apparatus, there are provided a roll medium supply device and a supporting member on which an image-receiving sheet and an ink sheet are superposed to be held thereon, and ink sheets can be removed without unexpected moving an image-receiving sheet on the supporting member even when various types of ink sheets are superposed on a single image-receiving sheet, then positions of images superposed plural times are confirmed while a part of the image-receiving sheet is held during an entire period of writing, and thus, final proofs are generated. On the surface of the supporting member stated above, there are provided openings for a vacuum so that the image-receiving sheet and the ink sheet are superposed and stuck to the drum-shaped supporting member, and there is further provided a vacuum sheet holding means which reduces pressure through the openings.

The thermal imaging apparatus stated above can constantly form proof images rapidly, accurately and at correct positions. However, large-sized proof images are demanded, and it is necessary to make the drum-shaped supporting member large when forming large-sized images on the apparatus as one stated above. When the supporting member is made large, it is difficult to superpose the image-receiving sheet and the ink sheet to hold them. The reason for the difficulty is as follows. When rotating a large-sized drum-shaped supporting member for exposure, a sheet tends to come off the supporting member. To avoid this, it is necessary to raise the degree of vacuum, which requires an apparatus which has a large capacity and is capable of generating the high degree of vacuum. In that case, air tends to leak through a joint of the drum-shaped supporting member, and an apparatus which can overcome these problems tends to be expensive and requires periodical maintenance. In addition, when winding a sheet round the supporting member, creases tend to be caused. Further, it is very difficult to attain the state of uniform close contact between the image-receiving sheet and the ink sheet over the entire surface thereof. When the state of uniform close contact can not be attained, there are caused serious problems on the finished proof images, such as a decline of stability of image output, namely, occurrence of a density difference in an image plane, irregular density in repeated output, occurrence of partial density fall and partial density rise in an image plane, and occurrence of blurred halftone dots.

Further, in the thermal imaging apparatus stated above, description is made on sheets of a type wherein dyes in an ink layer of the ink sheet are transferred. However, it has been made known that the same problems as in the foregoing are caused also on sheets of a thermal fusion transfer type wherein a colorant and a binder in the ink layer are transferred.

SUMMARY OF THE INVENTION

The invention has been achieved in view of the circumstances mentioned above, and its object is to provide a laser thermal transfer image forming method wherein, even when the degree of vacuum is relatively low, winding an image-receiving sheet and an ink sheet round a drum-shaped supporting member and holding them on the supporting object can be improved, and uniform close contact between the image-receiving sheet and the ink sheet can be elevated and stability of image output can be improved.

The invention has been achieved based on information that remarkable effects were observed by employing a sheet having a specific thickness under the condition wherein an average diameter of openings provided on the surface of a drum-shaped supporting member is specified, the opening ratio and the degree of reduced pressure are specified, and a circumferential length of the supporting object is specified.

The thermal transfer image forming method using a laser of the invention comprises the steps of placing an image-receiving sheet comprising a substratum and an image receiving layer, on a supporting drum having suction holes to be held thereon so that the surface of the image-receiving layer is faced outside, superposing an ink sheet comprising a substratum and an ink layer, on the image-receiving sheet held on the supporting drum so that the surface of the image receiving-layer contacts with the surface of the ink layer, imagewise irradiation laser light beam to the ink sheet held on the supporting drum which is rotated to transfer an image onto the surface of the image receiving layer, wherein during imagewise irradiation, the image-receiving sheet and the ink sheet are sucked through the suction holes of the supporting drum to be held thereon, the size of the ink sheet is larger than that of the image receiving sheet in both of longitudinal and lateral directions, the diameter of the suction hole in an area covered by the image-receiving sheet is within a range of from 0.4 mm to 2.5 mm, the opening ratio of the suction holes in the area covered by the image-receiving sheet is not less than 0.1%, the degree of the reduced pressure in the inside of the supporting drum is within a range of from 150 torr to 640 torr, the circumferential length of the supporting drum is not less than 600 mm, and the thickness of the image-receiving sheet is within a range of from 50 μm to 170 μm. Such the method makes it possible to improve the winding of an image-receiving sheet round the drum-shaped supporting member, hereinafter referred to as supporting drum, and the close adhesion between an ink sheet and the image-receiving sheet both laminated and held on the supporting drum, whereby, it is possible to maintain the excellent winding, and thereby to prevent partial density fall and partial density rise on the final image, and to improve the uniformity of image density in an image plane, thus, stability of repeated outputting of images can be attained in the course of outputting color proof images.

It is preferred that the opening ratio of openings in the non-image forming area in the area covered by an image-receiving sheet on the surface of the supporting drum is not less than 0.3% for enhancing the effect of the invention.

Figure 1:
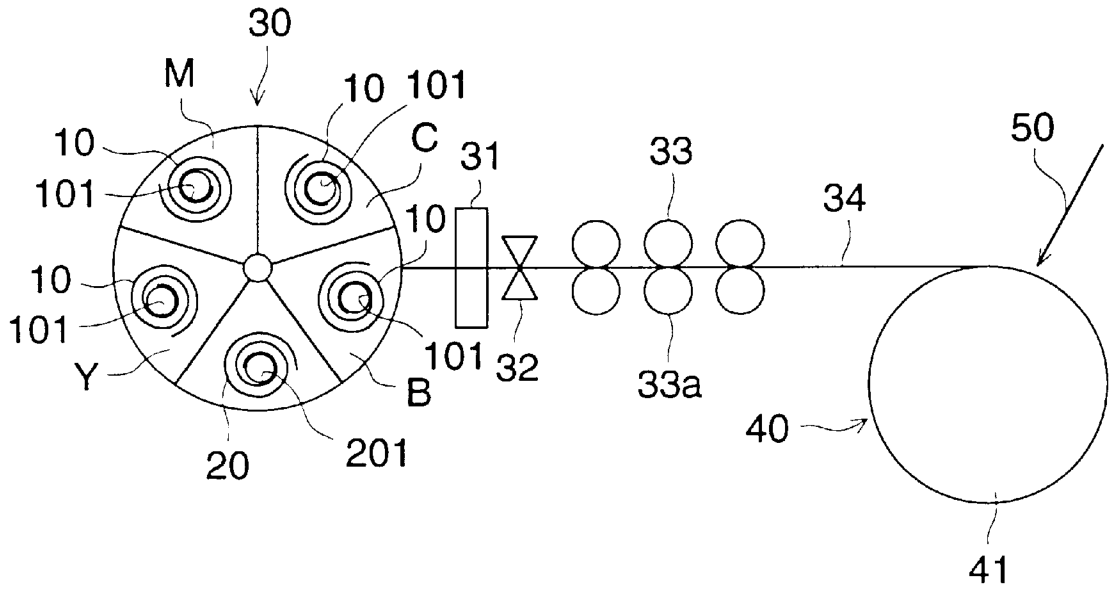
FIGS. 1 and 2 are a schematic drawing of an image recording apparatus according to the invention.

In the drawings, 10 is an ink sheet, 20 is an image-receiving sheet, 30 is an ink sheet supplying device, 41 is a supporting drum, 50 is a writing head and 60 is a outlet.

DETAILED DESCRIPTION OF THE INVENTION

An embodiment of an image recording apparatus related to the invention will be explained with reference to drawings. FIG. 1 is a schematic diagram of an image recording apparatus related to the invention.

Ink sheet 10 of each color of yellow, magenta and cyan (YMC), or yellow, magenta, cyan and black (YMCK), is wound round core 101 to be in a roll shape, and is loaded in drum-shaped supply device 30, while image-receiving sheet 20 is also wound round core 201 to be in a roll shape, and is loaded in the drum-shaped supply device 30. Roll-shaped ink sheet 10 is rolled with its ink surface facing inside, while image-receiving sheet 20 is rolled with its image-receiving surface facing outside, to prevent that the ink surface and the image-receiving surface are scratched, or dust sticks to the ink surface and the image-receiving surface. In such the embodiment, the ink sheet 10 is of clockwise twining and is loaded with its ink surface facing inside, and the image-receiving sheet 20 is also of clockwise twining and is loaded with its image-receiving surface facing outside, wherein whether the sheet is clockwise or counterclockwise depends on the direction in which the sheet is loaded in the supply device 30. Ink sheet 10 for each color and image-receiving sheet 20 are guided respectively to their prescribed supply positions to be drawn out by drawing-out means 31 when the supply device 30 is rotated clockwise or counterclockwise. The ink sheet 10 is drawn out with its ink surface facing downward, and the image-receiving sheet 20 is drawn out with its image-receiving surface facing upward, then, each of them is cut to a prescribed length by sheet cutter means 32, and each sheet is conveyed by conveyance means 33 composed of paired rollers **33*a* to be moved to exposure section 40. In the exposure section 40, there is arranged supporting drum 41. On the supporting drum 41, there is held image-receiving sheet 20 cut to the prescribed length with its image-receiving surface facing upward, then, writing head means 50 such as a laser beam is operated while rotating the supporting drum 41, under the condition that an ink surface of the ink sheet 10 cut to the prescribed length in the same way is superposed on the image-receiving surface to be laminated and held, so that ink in the ink sheet 10 is transferred onto the image-receiving surface of the image-receiving sheet. In the present invention, image-receiving sheet 20 and ink sheet 10 are laminated and held on supporting drum 41 by a vacuum type sheet holding means which is used to reduce pressure through suction holes represented by openings, hereinafter referred to as suction holes, provided on the supporting drum 41**. The effects of the invention are enhanced when the circumference speed of the supporting drum is not less than 7.4 m/sec.

It is preferable that a circumferential length of drum-shaped supporting object 41 is 600 mm or more, because large-sized images such as a 515 mm×724 mm size or more can be formed. Further, when an ink sheet or an image-receiving sheet is in size of 515 mm×724 mm or greater, there is produced remarkably the effect of the invention to make the image-receiving sheet or the ink sheet to wind around a drum-shaped supporting object properly. The optimum circumferential length (a length of the circumference of a drum) of the supporting object for offering an effect of the invention is within a range from 600 mm to 1250 mm.

With regard to a suction hole provided on the supporting drum 41, it is an indispensable condition that the diameters of 95% or more in number of the suction holes provided on the portion covered by the image-receiving sheet are each within a range from 0.4 mm to 2.5 mm. Preferably, the diameters of not less than 95% in number of the suction holes provided on the portion covered by the image-receiving sheet are each within a range from 0.4 mm to 1.5 mm. Though it is preferable that diameters of all suction holes provided on the portion covered by the image-receiving sheet are within a range from 0.4 mm to 2.5 mm.

When a diameter of a suction hole is smaller than 0.4 mm, holding capacity for an ink sheet and an image-receiving sheet is lowered, while when it is greater than 2.5 mm, a mark of a suction hole is noticeable, which is not preferable. However, with regard to the suction hole located in the area covered by an image-receiving sheet and on the non-effective image forming area a diameter in a range from 0.5 mm to 2.5 mm is preferable, and that in a range from 0.5 mm to 1.5 mm is more preferable. With regard to the suction hole located in the area covered by an image-receiving sheet and on the effective image forming area, when a diameter is within a range from 0.4 mm to 1.0 mm, excellent images are obtained and sheet holding is stable, which is preferable.

Incidentally, the effective image forming area is an area which is designated in advance so that an image is effectively formed thereon among the portions covered by an image-receiving sheet, while an area other than the effective image forming area, hereinafter referred to a non-effective image forming area, is an area which is designated in advance so that an image is not effectively formed thereon among the portions covered by an image-receiving sheet. It is naturally possible to designate the portion where images can be formed technically as a non-effective image forming area. It is preferable that a non-effective image forming area is provided in the vicinity of an edge of an image-receiving sheet, especially in the vicinity of the total circumference thereof among portions covered by an image-receiving sheet. With regard to suction holes attracting closely an ink sheet only, its diameter ranging from 0.5 mm to 2.5 mm is preferable. It is further possible to provide grooves each connecting a suction hole to another on the surface of a drum, and a preferable width of the groove in this case is not more than 0.7 mm.

In the invention, it is required that the opening ratio of suction holes in the area covered by an image-receiving sheet among suction holes provided on the surface of the supporting drum is not less than 0.1%. With regard to the number of suction holes, it is necessary that the opening ratio of suction holes in the area covered by an image-receiving sheet on the surface of the supporting drum is 0.1% or more. Now, the opening ratio of suction holes in the invention is defined as follows.

(Total area of suction holes in the area covered by an image-receiving sheet on the surface of a supporting drum)/(An area of the portion covered by an image-receiving sheet on the surface of a supporting drum)

When the opening ratio is less than 0.1%, holding of an image-receiving sheet and of an ink sheet is worsened, and a drum does not rotate at high speed smoothly. It is appropriate that the opening ratio in the area covered by an image-receiving sheet is within a range from 0.1% to 0.5%. Further, in the area where images are formed, namely effective image forming area, it is preferable, from the viewpoint of less influence on images, to lower the opening ratio to be 0.07% or more. It is preferable that the opening ratio is within the same range even when sucking grooves are provided.

In the present invention, it is preferable that the opening ratio of suction holes on the area where no image is recorded, namely non-effective image forming area, in the area covered by an image-receiving sheet on the surface of the aforesaid supporting drum, (Total area of suction holes on the non-image forming area in the area covered by an image-receiving sheet on the surface of a supporting drum)/(An area of the non-image froming area in the area covered by an image-receiving sheet on the surface of a supporting drum) is 0.3% or more. The reason for the foregoing is that the higher the opening ratio is, the better the sheet-keeping is, because of a non-image forming area, and when suction holes are present in the vicinity of an end portion of an image-receiving sheet, in particular, sheet-keeping is excellent and image reproduction is also excellent. It is optimum that the area which is concretely within a range from 0.3% to 1.0%. Incidentally, the non-image forming area is an area designated in advance to be an effective area to form an image among the portion covered by an image-receiving sheet, and the non-image forming area is not an area where image forming is impossible technically.

Figure 2:
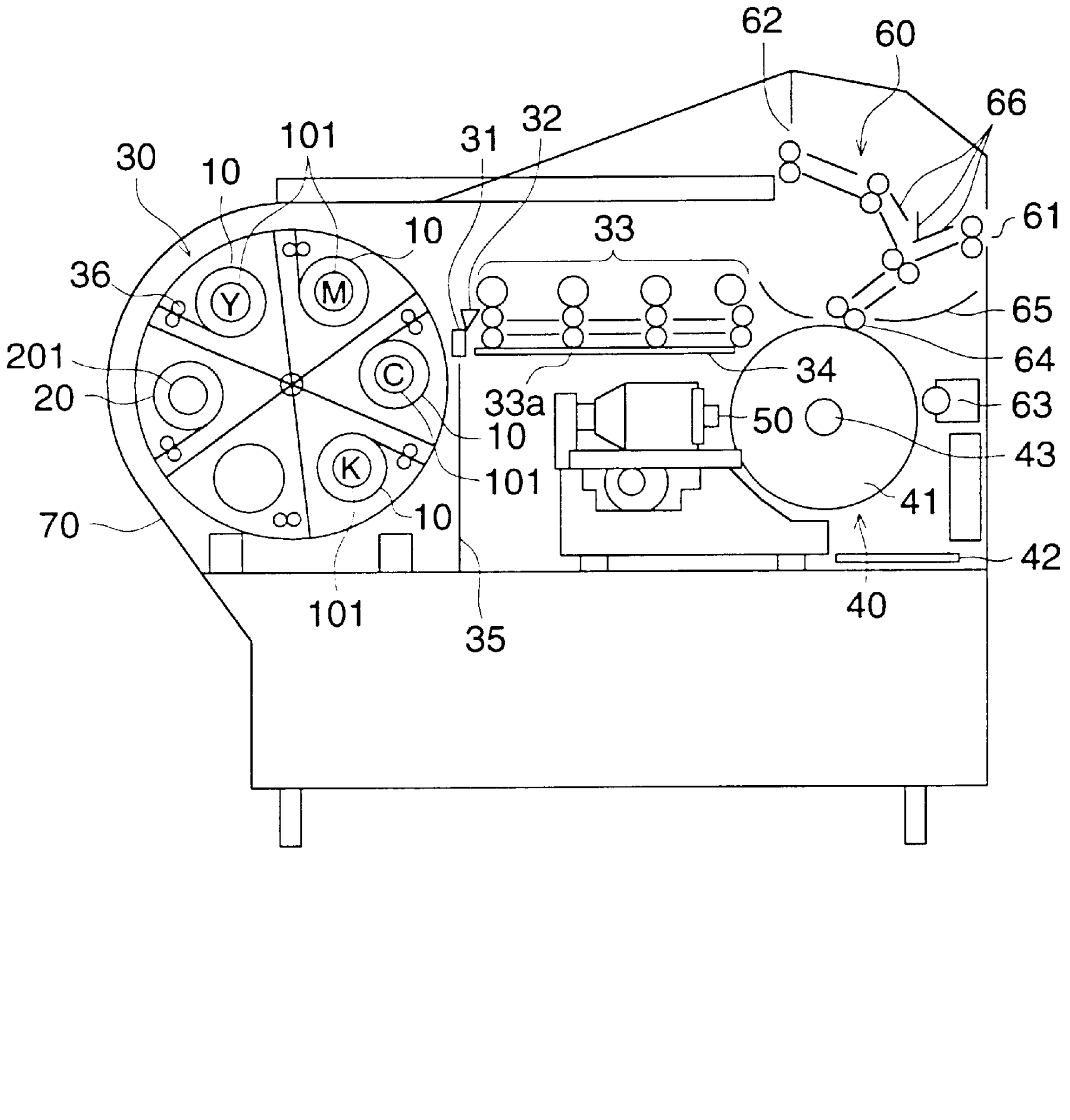

The invention will be explained more particularly with reference to a general view shown in FIG. 2. FIG. 2 is a schematic view of an image recording apparatus for making a proof image related to the invention, and a general view of a proof printing apparatus is shown. In this embodiment, components structured in the same manner as those in the embodiment in FIG. 1 are given the same symbols for explanation. An arrangement of components located inside cabinet 70 is basically the same as that in FIG. 1, and there are provided, from the left hand side in succession, supply device 30, drawing-out means 31, sheet cutter means 32, conveyance means 33, exposure section 40 wherein supporting drum 41 is provided, and writing head means 50, wherein bulkhead 34 is provided below the conveyance means 33 and bulkhead 35 is provided between the supply device 30 and the exposure section 40 to prevent dust from entering supporting drum 41 and the exposure section 40 when supplies are replaced and conveyed.

Sheet feeding section 36 is provided to be adjacent to supply device 30, and operations of the entire apparatus begin with drawing out of the tip of a roll-shaped sheet in the supply device 30. A length of a leading edge of image-receiving sheet 20 drawn out of the roll wound round core 201 is measured and the sheet is fed to sheet cutter means 32 where the sheet is cut by the cutter means to the longitudinal length, and the sheet thus cut is conveyed to supporting drum 41 by conveyance means 33, namely, by conveyance roll 33*a*. When the conveyance roll 33*a* operates, the sheet thus conveyed is sensed by a sheet sensor not shown and is stopped at that position. When the sheet is wound round the supporting drum 41, reflection from the sheet surface is received and the tip portion of the sheet is detected by the sensor, then the sheet is stopped. After that, the supporting drum 41 rotates clockwise, and the sheet loading position is determined and fixed. When operating a vacuum type sheet holding means or suction device, namely, when operating a suction pump or a blower not shown concretely, reduced pressure is led to the supporting drum 41. In the invention, the degree of reduced pressure in the supporting drum 41 sucked by the aforesaid vacuum type sheet holding means is required to be within a range from 150 torr to 640 torr, and when the degree of reduced pressure is lower than 150 torr, partial density fall and partial density rise of images tend to be caused, while when it exceeds 640 torr, on the other hand, sheet holding tends to be deteriorated.

At this point of time, the supporting drum 41 is made to be of reduced pressure, and all suction holes are led to the state of reduced pressure. Pressure roll 64 is moved so that it may come in contact with the leading edge of a sheet, and then, the pressure roll presses the sheet so that the sheet may come in close contact with the supporting drum 41. Due to the pressure reduction in the supporting drum 41, the sheet is attracted to suction holes to be held on the surface of the supporting drum 41. When the pressure roll 64 is applied, air located between the sheet and the surface of the supporting drum 41 is removed easily. Then, the supporting drum 41 rotates to return to the position where the leading edge of the sheet comes close to the location of conveyance roll 33*a*, and the pressure roll 64, on the other hand, is moved to the position where it does not touch the supporting drum 41 to be away from the surface of the supporting drum 41. Then, ink sheet 10 is taken out of supply device 30, then is cut to its longitudinal length by sheet cutter means 32, and is conveyed by conveyance means 33 to the supporting drum 41. Then, the ink sheet is taken up around the circumference of the supporting drum 41 in the same way as that for an image-receiving sheet, then is superposed on the image-receiving sheet 20 at the aimed position, and is fixed. In this case, it is necessary that the ink sheet 10 is cut to be longer than the image-receiving sheet 20 so that the ink sheet 10 can cover the image-receiving sheet 20, and that the width of the rolled ink sheet is rolled ink sheet is larger than that of the rolled image-receiving sheet. After that, pressure roll 64 comes in contact with the surface of the ink sheet 10, and the supporting drum 41 rotates until the trailing edge of the ink sheet 10 comes under the pressure roll 64.

The supporting drum 41 rotates clockwise to return the leading edge of the ink sheet 10 to the position where it comes under the pressure roll 64 again. The reason for applying the roll twice as stated above is as follows. Though it looks as if most air located between ink sheet 10 and image-receiving sheet 20 can be removed by the first rolling, there still is a possibility of existence of some slight residual air, and this residual air can not be recognized until an image is finished actually. Namely, a portion of residual air is reproduced as an area where image density is low. An effect to remove air that is not recognized is obtained by rolling twice for close contact between ink sheet 10 and image-receiving sheet 20. After the ink sheet 10 is fixed on the supporting drum 41, the pressure roll 64 leaves the supporting drum 41, and the supporting drum 41 is accelerated to rotate clockwise or counterclockwise up to the image writing speed. As the supporting drum 41 rotates, writing head means 50 crosses along the axial direction of the supporting drum 41, and images are transferred onto the image-receiving sheet 20.

After images have been transferred on the image-receiving sheet 20, the ink sheet 10 is removed from the supporting drum 41 without unexpected moving the image-receiving sheet 20, and is ejected out of the apparatus through used sheet outlet 61. In this case, another ink sheet 10 is superposed on image-receiving sheet 20 on the supporting drum 41 in succession, whereby, images are transferred onto image-receiving sheet 20 until aimed images are obtained. After image transfer has been completed, the image-receiving sheet 20 is ejected out of the apparatus through finished print outlet section 62.

Incidentally, as a preferable embodiment in each apparatus or means, there is given an example wherein conveyance roll 33*a* is composed of one having adhesive property, for example, and due to this, it is possible to prevent that dirt or dust either stuck to image-receiving sheet 20 or ink sheet 10, or generated when sheets are cut enters an image forming means or an image exposure section. With regard to the conveyance roll 33*a*, it is preferable that a set of conveyance means is composed of 12 rolls representing 4 sets each being composed of a group of 3 rolls, because a sheet which is cut to a length to be taken up around the circumference of the supporting drum 41 can be conveyed smoothly. Further, when adhesive sheet 42 is arranged on the bottom of the inside of cabinet 70 that supports an imagewise exposure section, falling substances such as dirt and dust generated during image writing, winding sheet or sheet cutting are caught effectively, which contributes to the clean inside of an image forming means or of an imagewise exposure section. It is further preferable to use silicone rubber as a material constituting the surface of pressure roll 64 provided to be adjacent to the supporting drum 41. Sometimes, the pressure roll 64 also serves as a means to convey ink sheet 10 and image-receiving sheet 20 which have been used for image forming on the supporting drum 41 respectively to the used sheet outlet 61 and the finished print outlet 62.

By using the silicone roller, it is possible to prevent that an image-receiving plane is soiled when it is pressed, and to prevent that an image-receiving plane is scratched by foreign materials sticking to the roll itself. Further, it is preferable to provide bulkhead plate 65 between outlet section 60 and an image forming means or between outlet section 60 and an imagewise exposure section. Due to this, it is possible to block falling substances such as dirt and dust coming from an outlet, and to avoid primary factors which adversely affect imagewise exposure or image forming. It is preferable that the surface of guide plate 66 located in the outlet section 60 is treated to be of a satin finish. Due to this, when the leading edge of the ink sheet and that of the image-receiving sheet hit the guide plate 66 to be determined in terms of direction of advancement, the sheets can be conveyed smoothly without causing excessive friction. Further, adhesive roll 63 may also be provided for the purpose of keeping the surface of the supporting drum to be on the clean state.

(Material supplying step)

Sheet supplying device 30 is composed of a rotary rack, and further has a circular plate erected vertically. On the surface of this plate on one side thereof, there are studded a plurality of material holding spindles arranged at regular intervals along the circumference of the plate, and each spindle is engaged with roll sheet 10 or roll sheet 20. One of them is image-receiving sheet 20, while other four of them are ink sheets 10, and remaining one spindle of them is a spare one. Each spindle is provided with sheet feeding section 36 corresponding to that spindle, and the tip of the roll engaged with the spindle is drawn out to be fed out of the rotary rack through a driving roll not shown. Though the spindle plays a part of a core in this case, it is also possible to provide separately a roll having a core in advance. The rotary rack rotates around its shaft, and conveys a roll of selected material to sheet cutter means 32. Then, the sheet is conveyed, passing through the cutter means, and is measured in terms of length to be cut. The material which has just been cut in this case is curled, because it has been wound in a roll shape. When this is held on the supporting drum 41, it can not be wound around the supporting drum properly due to its curling, and in addition, the following ink sheet 10 has curling in another shape. Therefore, deterioration of close contact for all of the supporting drum 41, the image-receiving sheet and the ink sheet is considerable.

With regard to the degree of curling of a cut sheet, in particular, the degree of curling of the cut sheet coming from the portion corresponding to the inside diameter of the roll sheet is greatly different from that of the cut sheet coming from the portion corresponding to the outside diameter of the roll sheet, and handling is extremely inconvenient in terms of laminated holding on the supporting drum 41.

In view of the circumstances stated above, the invention has solved the aforesaid problems caused by the curling of sheet by employing a material form with a specific thickness under the condition wherein an average diameter of openings provided on the surface of a supporting drum is specified, the opening ratio and the degree of reduced pressure are specified, and a circumferential length of the supporting drum is specified. In practical use, the values of each of these factors can be optionally chosen within the specified range according to the invention considering conditions such as the kind of apparatus, the number of image to be output, and the number of color to be used.

(Image forming step)

Figure 3:
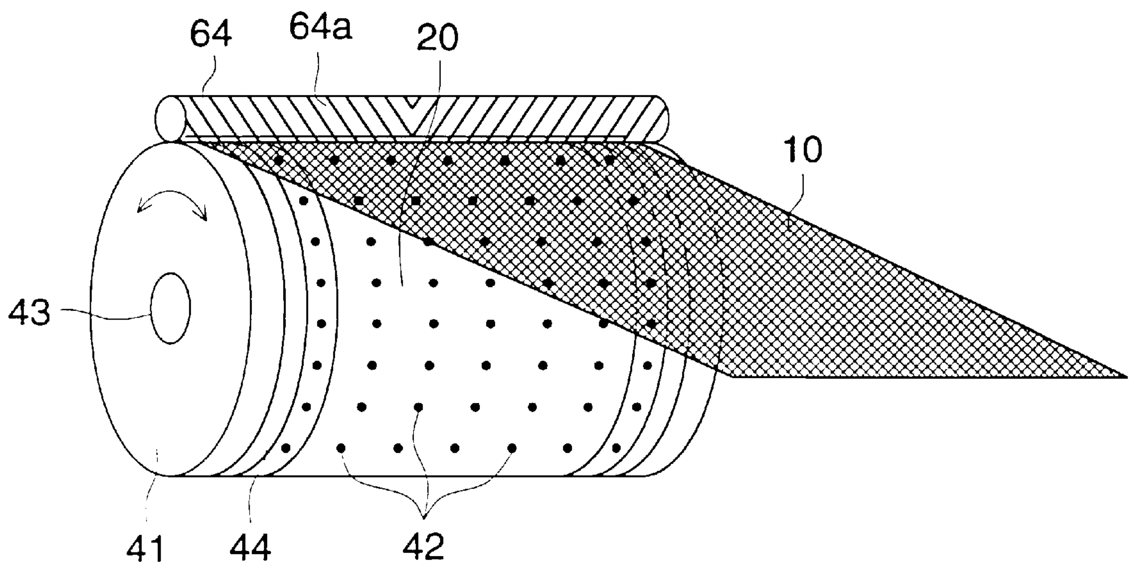
FIG. 3 is a perspective view of the supporting drum and pressure roller.

FIG. 3 shows a perspective view wherein image-receiving sheet 20 is taken up and wound around the circumferential surface of supporting drum 41, then, ink sheet 10 is further superposed on the image-receiving sheet 20 to cover it, and they are fixed by pressure roll 64. The pressure roll 64 is provided to be capable of being mounted on and dismounted from the supporting drum 41, and its material which is not adhesive is preferable, and those having grooves which can apply force in the direction perpendicular to the rotating direction of the pressure roll is more preferable. An example of this groove is groove 64*a* which is illustrated. The supporting drum 41 is one for carrying thereon thermal print media such as those wherein, when ink layers on ink sheet 10 are heated, the ink layers or dyes are transferred from the ink sheet 10 onto image-receiving sheet 20, and the image-receiving sheet 20 and the ink sheet 10 are superposed each other to be in close contact, while, pressure in the inside of the supporting drum 41 is reduced to suck the superposed sheets through suction holes with a suction pump, thus the superposed sheets are held on the surface of the supporting drum 41. A large number of suction holes 42 are provided on the surface of the supporting drum 41, and central inlet port 43 is led to a valve not shown which is connected to a suction device.

A valve is connected to the suction pump, and the state of reduced pressure can be generated inside the supporting drum 41 through the central inlet port 43 by the suction pump, in the invention. When the degree of reduced pressure is high, a load on the suction device is great, air leakage through the joint of the supporting drum tends to be caused, an image-receiving sheet is drawn into suction hole to cause cavities on the image-receiving sheet, thus the close contact with an ink sheet is retarded. When the degree of reduced pressure is low, on the other hand, the ink sheet and the image-receiving sheet can not be held on the drum properly, and air located between the ink sheet and the image-receiving sheet can not be removed sufficiently, resulting in insufficient close adhesion. Consequently, when the degree of reduced pressure inside the supporting drum that is sucked by the suction pump is established to be within a range from 150 torr to 640 torr, the problems stated above can be overcome.

On the circumstance of the supporting drum 41, there is formed protuberant portion, protuberant portion, 44 to travel round the supporting drum 41 on each of the left and right sides of the supporting drum 41. The height of the protuberant portion is within an interval of longitudinal lines of suction holes, and the protuberant portion are provided outside an area where image-receiving sheet 20 is fixed. It is preferable that a height of the protuberant portion is actually set to be within a range from (image-receiving sheet thickness+50 $\mu$m) to (image-receiving sheet thickness−10 $\mu$m), and it is not less than about 65 $\mu$m and not more than 225 $\mu$m. It is preferable that the protuberant portion is positioned near the image receiving sheet, and that a suction hole is provided between the edge of the image-receiving sheet and the protuberant portion.

Figure 4:
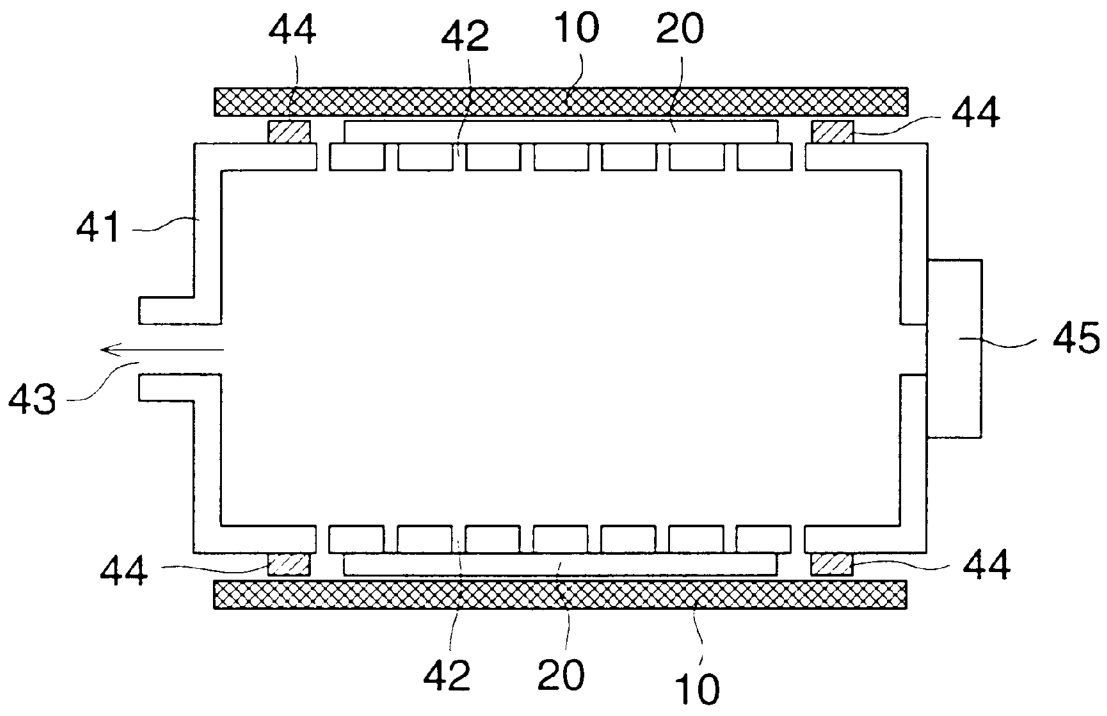
FIG. 4 is a cross-section of the supporting drum.

FIG. 4 is a lateral sectional view of supporting drum 41 separated and developed along a center line in the axial direction, which shows that the inside of the supporting drum 41 is decompressed through suction holes 42 from central inlet port 43, image-receiving sheet 20 is in close contact with the surface of the supporting drum to be covered by ink sheet 10 that is greater than the image-receiving sheet 20 in terms of width and length, and the ink sheet 10 is brought into close contact with the supporting drum 41 through the image-receiving sheet 20. The ink sheet is preferably larger than the image receiving-sheet by at least 2.5 cm in both of longitudinal and lateral directions. Hub 45 is connected with a driving motor not shown which is for an image forming drum and can be reversed and can be changed in speed. An object of protuberant portion 44 formed on the surface of the supporting drum 41 is to prevent that creases are caused on the surface of the ink sheet 10 when the ink sheet 10 is conveyed while being pulled on the surface of the image-receiving sheet 20. Due to this, it is possible to prevent that a fold and a crease on the sheet which have possibility to extend to an image forming area and to affect the final image adversely are caused on the ink sheet 10. Further, though it is difficult to suck all air on the portions along edges of the image-receiving sheet 20 completely, protuberant portion 44 can easily solve the problem of the drawing in of air in this portion. By conducting both suction and pressurization by the use of pressure roll 64 as shown in FIG. 3, residual air existing between the image-receiving sheet 20 and the ink sheet 10 can be removed efficiently.

The image recording sheet is described below.

Figure 5:
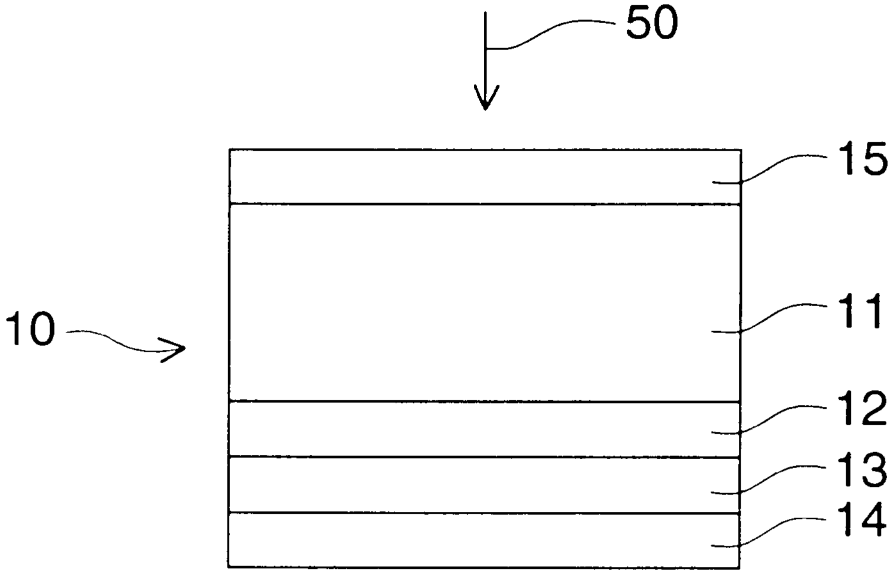
FIG. 5 is cross-sections of examples of ink sheet and image-receiving sheet.
Figure 5:
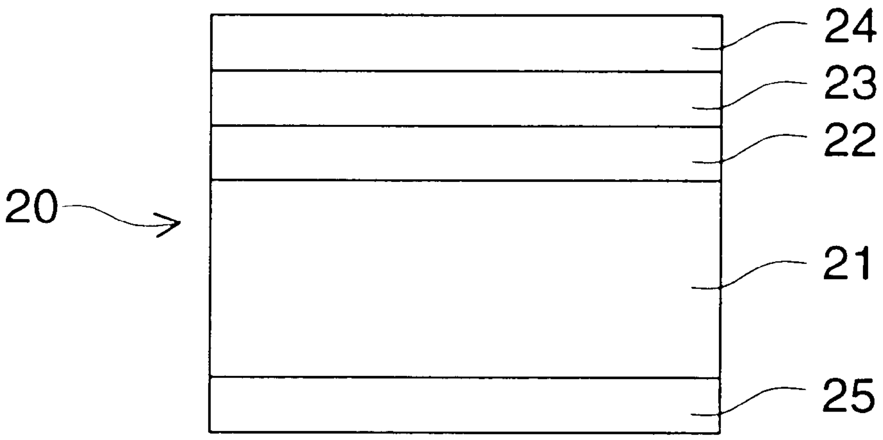

FIGS. 5(*a*) and 5(*b*) are each sections of examples the ink sheet 10 and the image-receiving sheet 20, respectively.

In the ink sheet 10 shown in FIG. 5(*a*), a cushion layer 12, a light-heat conversion layer 13 and a ink layer 14 are laminated on a surface of a transparent substratum 11 which is composed of, for example, poly(ethylene tetrephthalate), and a back-coat layer 15 is provided on the other surface of substratum. In the image-receiving sheet 20 shown in FIG. 5(*c*), a cushion layer 22, a peeling layer 23 and a image-receiving layer 24 are laminated on a surface of a transparent substratum 21 which is composed of, for example, poly (ethylene tetrephthalate), and a back-coat layer 25 is provided on the other surface of substratum.

The above-mentioned layer construction is only an example, and another layer construction is not excluded. For example, in the ink sheet, the cushion layer 12 may be omitted when the ink layer contains a sublimatable dye. The function of the light-heat conversion layer 13 to convert the laser light to heat may be omitted when the ink layer contains a light-heat conversion material. In the image-receiving layer, the peeling layer 23 may be omitted depending on the combination of the compositions of the cushion layer 22 and that of the image-receiving layer 24. In each of FIGS. 5(*a*) and 5(*b*), the arrangement of the layers is drawn according to the upper and lower position at the time of transportation and light exposure.

The ink sheet 10 and the image-receiving sheet 20 are described below.

<Ink sheet>

The ink sheet is basically composed of a substratum and an ink layer. A light-heat conversion layer may be arranged between the substratum and the ink layer. Furthermore, a cushion layer may be arranged between the light-heat conversion layer and the substratum.

A polymer film which is transparent to the wavelength of laser light used for imagewise exposure and has a high transportability and flatness, among the films and sheets described in JP O.P.I. 63-193886, lines 12 to 18 in lower left column. Particularly, a film of a resin having a high Tg such as poly(ethylene naphthalate) (PEN), poly(ethylene phthalate) (PET), syndiotactic polystyrene (PSP), poly (methyl methacrylate) (PMMA) and polycarbonate (PC) is preferable.

The thickness of the substratum of the ink sheet is preferably from 50 $\mu$m to 125 $\mu$m. When the thickness is less than 50 $\mu$m, wrinkles tend to be form at the time of winding on a drum-shape supporting means, and when the thickness is more than 125 mm, unevenness of the density in the transferred image tend to be formed.

Various treatments such as that for dimension stabilization and anti-static may be applied to such the plastic films. A subbing layer may be provided for suitably coating the foregoing layers on the substratum.

The ink layer of the ink sheet includes a sublimation type and a fusion transfer type. In the sublimation type, the dye is only transferred by heat generated by the light-heat conversion effect of the light-heat conversion layer receiving a high intensity light such as laser light. In the fusion transfer type, the ink layer is fused or softened and wholly transferred. The fusion transfer type ink layer may not be complete fused state at the time of transfer thereof.

The ink layer of the thermal fusion type ink sheet preferably contains a colorant in an amount of from 20 to 40 parts by weight and a resin having a melting point or softening point of from 40° to 150° C. in an amount of from 40 to 70 parts by weight. The thickness of the layer is preferably from 0.4 $\mu$m to 1.0 $\mu$m.

An inorganic pigment such as titanium oxide, carbon black, graphite, zinc oxide, Prussian blue, cadmium sulfide, iron oxide, and chromate of lead, barium and calcium, an organic pigment such as a pigment of an azo type, a thioindigo type, an anthraquinone, and a triphenodioxazine type, a vat dye, a phthalocyanine pigment and its derivative and a quinacridone pigment, and a dye such as an acid dye, a direct dye, a dispersion dye, an oil-soluble dye and a metal-containing oil-soluble dye, are usable as the colorant.

When the image transfer sheet is used for preparing a color proof element for graphic arts, an organic pigment to be used in a printing ink is preferably used. For reproduction of black color, it is suitable that carbon black is mainly used and a cyan, blue or violet pigment is added to control the tone according to necessity.

The amount of the colorant is preferably from 20 to 40%, more preferably from 25 to 35%, of the total weight of ink. It is preferable from the standpoint of the surface condition of the kink layer that the colorant is dispersed so that the average diameter of the colorant after mixing with the binder is smaller than the thickness of the ink layer.

The diameter of the dispersed particle of the colorant is preferably not more than 0.5 μm in average. A thermally fusible substance, a heat softenable substance and a thermoplastic resin are usable as the binder of thermal fusion transfer type ink layer.

A preferable principal component of the binder of the ink layer is a resin having a melting or softening point of from 40 to 150° C. The ink layer can be uniformly transferred with inhibited aggregation destruction thereof when the a resin is used as the principal component of the ink layer. It is confirmed that the transferring ability of the ink layer can be made satisfactory when an amorphous resin such as a styrene resin, a styrene-acrylate resin and a styrene-maleate resin is used as the principal component. Moreover, it is found that the anti-abrasion ability of the ink image formed on the image-receiving sheet is improved by addition of an ethylene-vinyl acetate resin or an ionomer resin in an amount of about 10% by weight of the binder. The combination of such the resins is effective for improving the smoothness of the edge of transferred image.

A plasticizer for raising the sensitivity by giving a plasticity, a surfactant for improving coating ability and a matting agent having a particle size smaller than the thickness of the ink layer to prevent the blocking of the layer, may be added to the ink layer. A thinner ink layer can be formed by using a fluorine-containing compound as the surfactant.

The thickness of the ink layer is preferably from 0.4 μm to 1.0 μm, more preferably from 0.5 μm to 0.8 μm. A smaller thickness causes a higher sensitivity of the ink layer, and the sensitivity is considerably raised when the thickness is 1 μm or less.

In the sublimate type ink layer, for example, a cellulose derivative such as cellulose acetate-hydrogenphthalate, cellulose acetate, cellulose acetate-propionate, cellulose triacetate and materials described in U.S. Pat. No. 4,700,207, polycarbonate, poly(vinyl acetate), polysulfon, poly(vinyl alcohol-co-acetal) and poly(phenylene oxide) are usable as the binder. The binder may be used in a coating amount of from approximately 0.1 $g/m^2$ to 5 $g/m^2$.

As the sublimate dye, for example, the following compounds are usable.

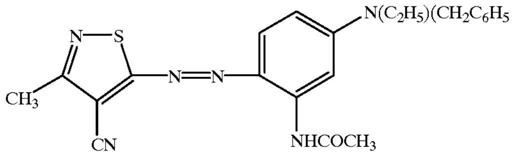

Magenta

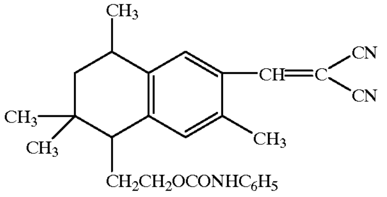

Yellow

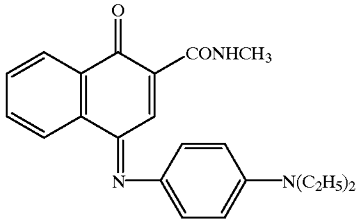

Cyan

A good image can be obtained when sublimate dyes described in U.S. Pat. Nos. 4,541,830, 4,698,651, 4,695,287 and 4,701,439 are used. These dyes may be used singly or in combination. The dye may be used in an amount of from 0.05 $g/m^2$ to 1 $g/m^2$.

An infrared absorbing dye may be contained in the ink layer. A cyanine dye such as that described in U.S. Pat. No. 4,973,572 can be used as the infrared dye. A layer containing spacer beads may be provided on the ink layer or the spacer beads may be added in the ink layer to make a certain distance between the image-receiving sheet.

The ink layer may be coated or printed by a printing technology such as gravure printing on the substratum.

In the case of sublimation type transfer, it is preferred to transfer the sublimate dye of the ink layer to the image-receiving sheet by means of a diode laser. The ink sheet containing the infrared absorbing dye is imagewise heated by the diode laser to sublimate the dye so as to transfer the image. The diode laser is controlled by a combination of signals transmitting the shape and the color of the image. As a result, the dye is heated and sublimated only at the position where the presence of dye on the image-receiving layer is required so that the color of the original image is reproduced.

The heat conduct efficiency of the light-heat conversion layer is considerably raised when the light-heat conversion layer is provided so as to adjoin the layer with the thermal fusion type ink sheet. When the light-heat conversion layer is adjoined to the ink layer, heat energy converted from light energy in the light-heat conversion layer directly heats the ink layer through the interface of the ink layer and the light-heat conversion layer. As a result of that, the ink layer is easily separated at the interface of the ink layer and the light-heat conversion layer, and the ink layer is transferred with a high efficiency. The light-heat conversion substance is a substance capable of absorbing light and converting to heat with a high efficiency. Carbon black has almost the same light-heat conversion efficiency within the full range of wavelength usually used. Accordingly, carbon black is advantageous to prepare an ink sheet suitable for any light source. A resin having a temperature not less than 360° C. at which the weight reduction rate is become by 50% measured by TGA method for measuring the heat decomposition point in the nitrogen atmosphere and a temperature raising rate of 10° C./minute, is preferable as the resin constituting the light-heat conversion layer. It is advantageous to contain such the resin in a ratio of 70% or more by weight of the whole resin in the light-heat conversion layer to prevent the unnecessary transfer of the light-heat conversion layer. A choice of light absorbing substance is expanded by the use of such the resin. A light-heat conversion layer containing a water-soluble polymer has a high separation ability from the ink layer. Such the layer also has a high heat resistivity at the time of light irradiation, and an ablation is difficultly formed even when the layer is excessively heated.

When the water-soluble polymer is used, It is preferable that the carbon black is modified to hydrophilic or dispersed in an aqueous system. The thickness of the light-heat conversion layer in the ink sheet is preferably from 0.4 μm to 1.2 μm, more preferably 0.5 μm to 1.0 μm. The content of carbon black in the light-heat conversion layer is preferably decided so that the transmission optical density at the wavelength of the light source to be used for image recording is from 0.3 to 3.0, more preferably from 0.7 to 2.5. The optimal region of the absorbance is to be decided based on the intensity of the irradiated light.

A thinner light-heat converting layer is preferable since heat energy generated in the layer is more effectively conducted to the ink layer, and the effect of the light-heat converting layer is considerably increased when the thickness thereof is 1.2 μm or less.

In the case of carbon black, a suitable effect can be obtained when the amount of carbon black is not more than 40% by weight, and unnecessary transfer of the light-heat conversion is prevented.

The cushion layer is particularly effective in the ink sheet having the thermal fusion transfer type ink layer since the cushion layer is provided to raise the contactness of the ink sheet with the image-receiving sheet. The cushion layer is a layer having a thermally softening ability or an elasticity. For the cushion layer, a substance capable of sufficiently deforming by heat, a substance having a low elastic modulus or a substance having a rubber elasticity may be used. In concrete, polymers the same as those the polymers usable in the cushion layer of the image-receiving layer later-mentioned may be used. The cushion layer can be prepared by coating, laminating or pasting of film to giving a certain thickness to the layer. As the method to form the cushion layer, the method the same as that for forming the image-receiving layer of the image-receiving sheet can be applied. When a filled cushion layer having a smooth surface is further formed, which the layer is preferably formed by a coating procedure. The thickness of the cushion layer is preferably not less than 2 μm, more preferably mot less than 4 μm. The transmittance of the substratum and the cushion layer at the wavelength of the light source is preferably not less than 70%, more preferably not less than 80%, for absorbing the light energy from the source without loss. Accordingly, it is preferable to use a substratum and a cushion layer each has a high transparency and to reduce reflection at the interface of the cushion layer and the substratum. For reducing the reflection at the interface of the cushion layer and the substratum, it is preferable that the refractive index of the cushion layer is smaller by 0.1 or more than that of the substratum.

To prepare the ink sheet, layers different from each other in the function and the property thereof are laminated on the substratum. Although some methods have been known for preparing such the laminated layer, the following methods are preferred to enhance the properties of ink sheet.

One of the preferable methods is that the cushion layer, the light-heat conversion layer and the ink layer are coated on the substratum in due order. In such the case, the cushion layer may be previously provided by an extrusion method or an extrusion laminate method since the surface of cushion layer is adhesive. It is preferable to form a smooth layer so that the mirror glossiness at 75°, according to JIS Z-9741-1983, of the surface of the light-heat conversion layer coated on the cushion layer is not less than 65. A high quality of the final image can be obtained by providing the ink layer on the cushion layer having such the high smoothness. A method is applicable in which a the ink layer and the light-heat conversion layer are provided on the peeling surface of a peelable support, and thus obtained sheet is pasted with the surface of a cushion layer provided on a substratum, then the peelable support is peeled off to prepare the ink sheet. Such the method is useful to prepare a ink sheet excellent in high smoothness having a mirror glossiness at 75° of 80 or more according to JIS Z-9741-1983.

In such the method, the peeling force F1 between the peeling surface and the ink layer is made so that the peeling force Fl is smaller that the peeling force F2 between the ink layer and the light-heat conversion layer. F1 of not more than 10 g/cm is suitable to prepare the ink sheet. After pasting the light-heat conversion layer and the cushion layer, the peelable support can be successfully peeled by making the curvature θ of the peelable support to 180° or less at the time of peeling.

The peelable support is preferably a smooth plastic sheet containing little amount of a filler, and the thickness of it is preferably not more than 50 μm from a viewpoint of the peeling procedure. The peeling surface can be formed by a cross-linked layer, a layer substantially insoluble in the coating solvent of the ink layer or a layer of a compound containing a fluorine atom or a long-chain alkyl group. Although the cross-linked peeling layer may be widely selected from one thermally hardened and one UV hardened, a non-silicone compound is preferred from a standing point of the reduction of sensitivity of the ink layer after peeled. However, a higher fatty acid modified silicone and a polyester modified silicone can be used for forming a suitable peeling surface since they exceptionally causes no reduction in the sensitivity. When the ink layer is organic solvent-soluble, a layer composed of water-soluble resin such as a resin having a hydroxyl group, a carboxyl group or an ammonium group is preferable, which is cross-linked by a cross-linking agent such as a melamine compound, an isocyanate compound and a glyoxal derivative,. A phosphazene resin can also be suitably used.

<Image-receiving sheet>

The image-receiving sheet comprises a substratum and an image-receiving layer provided on the substratum. When the image formed on the image-receiving sheet is re-transferred to a final support, a cushion layer is preferably provided between the substratum and the image-receiving layer. A peeling layer may be provided between the image-receiving layer and the cushion layer, and a back-coat layer may be provided on the side of the substratum opposite the side on which the image-receiving layer is provided.

The thickness of the image-receiving sheet is preferably from 50 μm to 170 μm, in total. The image-receiving sheet is suitably held on the supporting drum without formation of a mark of the suction opening of the supporting drum when the thickness of the image-receiving sheet is within such the range.

A thermal fusion type image-receiving sheet is applied when the thermal fusion type ink sheet is used. The image-receiving layer of the thermal fusion image-receiving sheet comprises a binder resin and a matting agent, and the thickness of the image-receiving layer is preferably from 0.3 μm to 3.0 μm.

The volume average diameter of the matting agent is preferably larger by from 1.5 μm to 5.5 μm than the thickness of the thickness of the layer without the matting agent. The contactness of the ink sheet and the image-receiving sheet is suitably held without fogging by the presence of the matting agent having a diameter within such the range. Moreover the image-receiving layer containing the matting agent having such the average diameter gives good surface impression after the image transfer. Fine particles of known organic resin such as an acryl resin such as poly(methyl methacrylate), a fluorine-containing resin and a silicone resin may be used as the material of the matting agent. The organic fine particle has a sufficient strength and anti-solvent ability and improves the glossiness of the final image. The number of protuberance caused by the matting agent on the surface of the image-receiving sheet is preferably 200 to 2,000 per $mm^2$ from the viewpoint of the glossiness of the finally transferred image. When the number of protuberance is within such the range, air between the image-receiving sheet and the ink sheet can be uniformly sucked and the sheets are suitably contacted.

A known binder can be used as the binder of the image-receiving sheet without any limitation. Among them, an acrylate type or methacrylate type binder such as a polyacrylate and a polymethacrylate is preferable. Such the resins may be used singly or in combination.

In the thermal fusion type image-receiving layer, a water-soluble resin may be optionally used together with an aqueous emulsion of the above-mentioned polymer. When the water-soluble resin is used, the water-soluble resin is preferably used within the range of not more than 30% by weight of the aqueous emulsified resin which is the principal component of the image-receiving layer. The static friction coefficient between the image-receiving layer and the ink layer is preferably within the range of from 0.3 to 0.7 for preventing the double printing of color images caused by move of the sheet when plural color images are transferred one upon another and maintaining the transporting ability of the sheets at the time of separation and transportation of the ink sheet and the image-receiving sheet after completion of the image formation.

Defects on the transferred image caused by intrusion of fine dusts between the image-receiving sheet and the ink sheet can be reduced by providing the cushion layer. In an ordinary thermal fusion transfer process, the ink layer of ink sheet has a thickness of 2 μm or more and the viscosity of the fused resin is set at a very low level. Accordingly, the dust does not raise a serious problem since the dust caught between the ink sheet and the image-receiving sheet is covered with the fused ink layer. However, in the light-heat conversion type recording process using a thin colorant layer such as above-mentioned, the dusts existed between the ink sheet and the image-receiving sheet raise a problem since the dusts cause clear defects in the transferred image.

The cushion layer to be provided on the image-receiving sheet is preferably a layer having an elastic modulus of from 1 to 250 $kg/mm^2$, more preferably from 2 to 150 $kg/mm^2$, at 25° C. or a layer having a penetration defined in JIS K2530-1976 of from 15 to 500, more preferably 30 to 300. The contactness of the ink sheet and the image-receiving sheet is increased by providing such the cushion layer. As a result of that, the defects of the transferred image are reduced since the floating of the sheets is reduced even when the dusts intrude between the ink sheet and the image-receiving sheet. Moreover, the transferring sensitivity is raised by the presence of the cushion layer.

A rubber or a resin each having a low glass transition point (Tg) is preferably used as the principal material of the cushion layer. Among them, one having a low molecular weight such as a weight average molecular weight of not more than 100,000 is suitably used. However, a resin having a molecular weight larger than the above-mentioned may be used if the material has a property satisfying requirements for the cushion layer. A plasticizer may be added to a resin to lower the glass transition point of the resin so as to give a property suitable for the cushion layer to the resin. The cushion layer can be formed by coating a solvent solution of resin, and the layer can also be formed by coating a coating liquid of an aqueous system such as a latex or an emulsion of the resin. A water-soluble resin is also usable. These resins may be used singly or in combination as a mixture according to necessity. A material other than the above-mentioned can be given a property suitable for the cushion layer by addition of various additives. As the additives, a substance having a low melting point such as a wax and a plasticizer are usable. The amount of such the additive may be selected without any limitation so that the suitable property is obtained in the combination with a basic material of the cushion layer. In general, the amount of the additive is preferably not more than 10%, more preferably not more than 5%, by weight of the cushion material. The thickness of the cushion layer is preferably not less than 10 μm, more preferably not less than 20 μm. A thickness of not less than 30 μm is preferable when the image is re-transferred to another substratum such as coated paper or high quality paper.

As the binder of the foregoing peeling layer, a styrene resin or a cross-linked styrene resin, a thermally hardenable resin having a Tg of not less than 65° C., and a hardened substance of these resins are usable. An ordinary hardener such as an isocyanate and melamine can be used to harden the resins. A polycarbonate resin, an acetal resin and ethyl cellulose are preferred from the viewpoint of storage ability.

An image-receiving sheet excellent in the easiness of handling can be obtained by addition of an electric conductive material into the peeling layer. The static electricity generated between the image-receiving layer and the peeling layer, when the image formed on the image-receiving sheet is transferred to the final substratum, is inhibited and the attraction of dust on the sheet is prevented.

The peeling layer can be formed on the cushion layer by coating a solution of raw material in a solvent or a dispersion of the material in a form of latex by a coating means such as a blade coater, a roller coater, a bar coater, a curtain coater or a gravure coater or a lamination of hot-molten material. The peeling layer can also be formed by another method in which a layer of the raw material of the peeling layer is provided on a temporary substratum by coating a solution or dispersion latex of the material, and the layer is pasted with the cushion layer and then the temporary is peeled off.

A cation surfactant, an anion surfactant, a nonion surfactant, a high molecular ant-static agent, an electric conductive fine particle, and a compound described in "11290 Commercial Chemicals", p.p. 875–876 are usable as an ordinary antistatic agent. A substance having a high electric conductivity is preferable in the foregoing substances known as the antistatic agent. The use of a metal layer formed by evaporation is restricted since such the layer tends to cause a degradation in the cushion property. It is preferable for preventing the generation of static electricity at the time of peeling the image-receiving layer to make the specific surface resistivity to not more than $1\times10^{-10}$ Ω at a temperature of 23° C. and a relative humidity of 55%.

The image-receiving sheet and the final image substratum are brought in very dried state when the image-receiving layer is transferred from the image-receiving sheet to the final image substratum since the image re receiving sheet and the final image substratum are heated and pressed by a laminator. Accordingly, a resistivity nor more than $1\times10^{-10}$ Ω is preferred.

An image-receiving sheet for sublimation transfer is used when the ink layer of the ink sheet is a sublimation type. Such the image-receiving sheet is at least composed of a substratum, a cushion layer and an image-receiving layer, and a back-coat layer may be provided on the surface of substratum opposite to the surface on which the image-receiving layer is provided. Preferable materials of preferable cushion layer and image-receiving layer are different from those of ink sheet having the fusion type ink layer.

The material of the cushion layer of the sublimation type image-receiving sheet can be selected from a polycarbonate, a polyester, a polyvinylacetal, a polyurethane, a poly vinyl chloride, a polycaprolactone and a polyolefin. A polyvinylacetal such as poly(vinyl alcohol-co-butyral), a polyolefin such as polypropylene, and a linear polyester derived by esterification of a di-basic aromatic acid such as phthalic acid or a di-basic aliphacyclic acid such as cyclohexane dicarboxylic acid with a short chain aliphatic diol such as ethylene glycol or an aromatic bisphenol such as bisphenol A.

The coating amount of the cushion layer is preferably not less than 0.5 g/m$^2$, more preferably from approximately 5 to 50 g/m$^2$, further preferably from approximately 10 to 50 g/m$^2$.

The image-receiving layer comprises a polycarbonate, a polyurethane, a polyester, a poly(vinyl chloride), a cellulose ester such as cellulose acetate lactate and a cellulose acetate propionate, a poly(styrene-acrylonitrile), a poly (caprolactone), a polyvinylacetal such as poly(vinyl alcohol-co-butyral), a mixture thereof or a known raw material usable in a polymer dye image-receiving element. Generally, a good result can be obtained when the resin is used in an mount of from 0.2 to 5 g/m$^2$.

A back-coat layer may be provided on the substratum of both types of image-receiving sheet. The back-coat layer is effective to prevent blocking of the rolled image-receiving sheet, and to improve the uniform contactness of the image-receiving sheet and the ink sheet superposed on the supporting drum. The back-coat layer is comprised of a binder resin and a matting agent, and an antistatic agent and a surfactant for improving the coating ability may be added to the back-coat layer according to necessity.

A commonly used polymer such as gelatin, poly(vinyl alcohol), methyl cellulose, nitro cellulose, acetyl cellulose, an aromatic polyamide resin, a silicone resin, an epoxy resin, an alkyd resin, a phenol resin, a melamine resin, a fluorine-containing resin, a polyimide resin, a urethane resin, an acryl resin, a urethane-modified silicon resin, a polyethylene resin, a polypropylene resin, a Teflon resin, a polyvinylbutyral resin, a poly(vinyl chloride) resin, poly(vinyl acetate) resin, a polycarbonate resin, an aromatic boron compound, an aromatic ester, a fluorized polyurethane, and a polyethersulfon is usable as the binder of the back-coat layer.

It is effective to use a cross-linkable water-soluble resin as the binder of the back-coat layer for preventing fall out of the powder of matting agent and for improving the scratch resistivity of the back-coat layer. The use of such the binder is largely effective on the prevention of blocking during the storage of the sheet.

For cross-linking the binder, any means such as heat, active radiation, pressure or a combination thereof may be applied without any limitation according to the property of the cross-linking agent used. On the side of the substratum on which the back-coat layer is provided, an adhesive layer may be provided to give a adhesiveness with the back-coat layer.

An organic or inorganic fine particle is preferably added to the back-coat layer as the matting agent. As the organic matting agent, a fine particle of poly(methyl methacrylate), polystyrene, polyethylene or polypropylene, a fine particle of radical polymerized polymer, and that of a condensed polymer such as polyester or polycarbonate are usable.

The provided amount of the back-coat layer is preferably from 0.5 to 3 g/m$^2$.

The matting agent preferably has a number average diameter larger by from 5 to 20 μm than the thickness of the back-coat layer omitting the matting agent. It is preferred that the particles having a diameter of not less than 8 μm is provided in a ratio of not more than 5 mg/m$^2$, more preferably from 6 to 600 mg/m$^2$. Defects caused by dust can be reduced by the presence of such the amount of the matting agent. Defects caused by an excessively large particle can be reduced and the satisfactory effect can be obtained by a smaller amount of matting agent when a matting agent having a narrow particle size distribution is used. The size distribution is expressed by the ratio of $\sigma/r_n$ or the variation coefficient of the particle size distribution, in which σ is the standard deviation of the size distribution and $r_n$ is the number average diameter of the particles. Particles having a variation coefficient of not more than 0.3 is preferable, and that having a variation coefficient of not more than 0.15 is more preferable.

EXAMPLES

In the followings, "part" means "part by weight".

<Preparation of image-receiving sheet>

Thermal fusion type Image-receiving sheet 1 a) The following coating liquid of back-coating layer was coated by a bar coater on a PET base film, T100 manufactured by Diafoil-Hoechst Co., Ltd., having a thickness of 100 μm and dried so as to form a back-coat layer having a coated amount is 0.3 g/m$^2$.

| Back-coat layer coating liquid 1 | |
|---|---|
| Poly(vinyl alcohol) EG-05, Nihon Gousei Kagaku Co., Ltd. | 9.5 parts |
| PMMA particle MX-300, average diameter: 3 μm, Soken Kagaku Co., Ltd. | 0.6 parts |
| Purified water | 170 parts |
| Isopropyl alcohol | 20 parts |

b) Then the following cushion layer coating liquid was coated by an applicator and dried on the other side of the base film so as to form a cushion layer having a thickness of 30 μm.

| Cushion layer coating liquid 1 | |
|---|---|
| Latex of aryl resin Yodosol AD92K, Kanebo NSC Co., Ltd. | 100 parts |

c) Next, the following peeling layer coating liquid was coated on the cushion layer by a wire bar coater to form a peeling layer having a thickness of 1.8 μm.

| Peeling layer coating liquid 1 | |
|---|---|
| Ethyl cellulose Ethocel 10, Daw Chemical Co., Ltd. | 10 parts |
| Isopropyl alcohol | 90 parts |

d) Thereafter, the following image-receiving layer coating liquid was coated on the peeling layer by a wire bar and dried to form a image-receiving layer having a coated amount of 1.5 g/$m^2$.

| Image-receiving layer coating liquid 1 | |
|---|---|
| Latex of polyacrylic acid Yodosol A5805, solid content 55%, Kanebo NSC Co., Ltd. | 25 parts |
| Dispersion of matting agent MX-40S, Solid content: 30%, Soken Kagaku Co., Ltd. | 1.8 parts |
| Fluorized resin Sumirez Resin FP150, solid content: 15%, Sumitomo Kagaku Co., Ltd. | 4.2 parts |
| Isopropyl alcohol | 9 parts |
| Purified water | 60 parts |

The total layer thickness of the image-receiving layer thus obtained was approximately 134 μm.

Sublimation type Image-receiving sheet 2,

A cushion layer, a peeling layer and an image-receiving layer were formed on a PET base film having a thickness of 100 μm, T-110 manufactured by Diafoil-Hoechst Co., Ltd., in a manner similar to that in the foregoing image-receiving sheet 1 so as to prepare Image-receiving sheet 2.

| Cushion layer coating liquid 2 | |
|---|---|
| Poly(vinyl acetal) Kw-1, solid content: 19%, Sekisui Kagaku Co., Ltd. | 60 parts |
| Purified water | 40 parts |

Then the following peeling layer coating liquid was coated on the cushion layer by a wire bar coater and dried to form a peeling layer having a thickness of 0.25 μm.

| Peeling layer coating liquid 2 | |
|---|---|
| Reactive siloxane polymer Syloff 7146, Daw Corning Co., Ltd. | 9.1 parts |
| Cross linking agent Syloff 7048 Daw Corning Co., Ltd. | 0.04 parts |
| Toluene | 90.86 parts |

Next, the following image-receiving layer coating liquid was coated by a wire bar coater on the peeling layer and dried to form an image-receiving layer having a coated amount of 4.1 g/$m^2$.

| Image-receiving layer coating liquid 2 | |
|---|---|
| Poly(vinyl butyral) BH-3, Sekisui Kagaku Co., Ltd. | 9.7 parts |
| Cross-linked PMMA particle MX-1500, average diameter: 15 μm, Soken Kagaku Co., Ltd. | 0.3 parts |
| Ethanol | 50 parts |
| Methyl ethyl ketone | 40 parts |

The total thickness of the layers of Image-receiving sheet 2 was approximately 120 μm.

<Preparation of ink sheet>

Ink sheet 1, fusion type a) A substratum was prepared which has a back-coat layer formed in the same manner as in the foregoing image-receiving sheet. The following cushion layer coating liquid was coated by an applicator on the surface of the substratum opposite to the back-coated surface and dried to form a cushion layer having a thickness of 6 μm.

| Cushion layer coating liquid | |
|---|---|
| Styrene/ethylene/butylene/styrene resin G1657, Shell Chemical Co., Ltd. | 14 parts |
| Tackifyer Superester A100 Arakawa Kagaku Co., Ltd. | 6 parts |
| Methyl ethyl ketone | 10 parts |
| Toluene | 80 parts |

b) Then the following light-heat conversion layer coating liquid was coated by a wire bar coater on the cushion layer and dried to form a light-heat conversion layer having a coated amount of 0.7 g/$m^2$.

| Light-heat conversion layer coating liquid 10 wt-% aqueous solution of poly(vinyl alcohol) | |
|---|---|
| Gohsenol EG-30, Nihon Goseisi Kagaku Co., Ltd. | 6.7 parts |
| Dispersion of carbon black, solid content: 30% SD-9020, Dainihon Ink Co., Ltd. | 0.9 parts |
| Water | 0.6 parts |
| Isopropyl alcohol | 1.8 parts |

c) Thereafter, the following ink layer coating liquid was coated by a wire bar coater on the light-heat conversion layer and dried to form an ink layer having a coated amount of 0.6 g/$m^2$.

| Ink layer coating liquid | |
|---|---|
| Dispersion of magenta pigment MHI magenta #1038, pigment content: 10% by weight, average particle diameter: 0.16 μm, Mikuni Shikiso Co., Ltd. | 12 parts |
| Styrene/acryl resin Himer SBM73F, Sanyo Kasei Co., Ltd. | 2.4 parts |
| Ethylene/vinyl acetate resin Evaflex EV40Y, Mitsui du Pont Polychemical Co., Ltd. | 0.2 parts |
| Fluorine-containing surfactant Surfron S-382, Asahi Glass Co., Ltd. | 0.1 parts |
| Methyl ethyl ketone | 60.5 parts |
| Cyclohexanone | 24.8 parts |

Ink sheet 2, sublimation type

A substratum was prepared which has a back-coat layer formed in the same manner as in the foregoing image-receiving sheet. The following ink layer coating liquid was coated by an applicator on the surface of the substratum opposite to the back-coated surface and dried to form an ink layer having a coated amount of 1.2 $g/m^2$.

| Ink layer coating liquid | |
|---|---|
| Magenta dye | 52 parts |
| Yellow dye | 6 parts |
| IR absorbing dye | 7 parts |
| Cellulose acetate propionate | 35 parts |
| Mixture of dichloromethane/1,2-trichloroethane, in a ratio of 1:1 | 90 parts |

Magenta dye

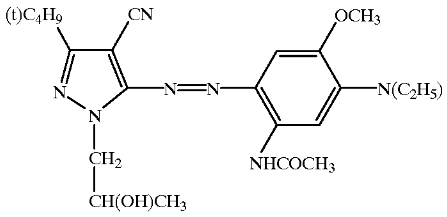

Yellow dye

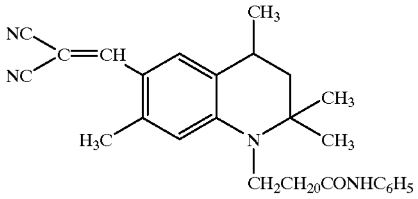

IR absorbing dye

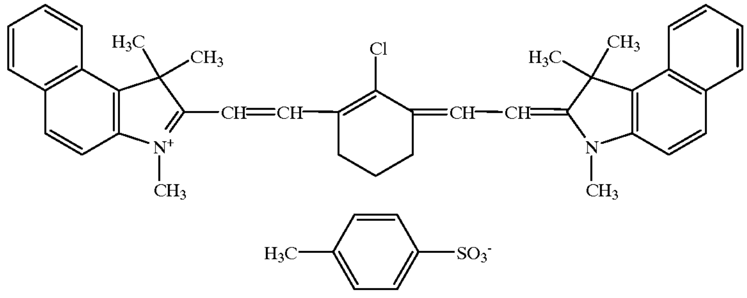

A supporting drum having a diameter of 23.5 cm and a width of 85 cm was used. The circumferential length of the supporting drum was 737.9 mm. The image-receiving sheet had a width of 79 cm and a length of 58 cm, and the ink sheet had a width of 84 cm and a length of 58 cm. The image-receiving sheet and the ink sheet were superposed and held on the supporting drum. The effective area of the image had a width of 77 cm and a length of 54 cm. The shape of suction hole of the supporting drum are shown in Table 1. In the table, the average opening ratio is a opening ratio of the suction holes in the area covered by the image-receiving sheet, and the diameter of ink sheet suction hole is a diameter of suction hole for sucking the portion of ink sheet overhung from the image-receiving sheet.

TABLE 1

| Supporting drum No. | Within effective image forming area: Diameter of suction. hole μm | Within effective image forming area: Opening ratio % | Without effective image forming area: Diameter of suction hole μm | Without effective image forming area: Opening ratio % | Average opening ratio % | Diameter of ink suction hole μm |
|---|---|---|---|---|---|---|
| 1 | 0.3 | 0.05 | 0.3 | 0.3 | 0. 08 | 0.3 |
| 2 | 0.5 | 0.05 | 0.5 | 0.3 | 0.08 | 0.5 |
| 3 | 0.5 | 0.07 | 0.5 | 0.3 | 0.10 | 0.5 |
| 4 | 0.9 | 0.1 | 0.9 | 0.3 | 0.13 | 0.9 |
| 5 | 1.1 | 0.07 | 1.1 | 0.3 | 0.10 | 1.1 |
| 6 | 0.9 | 0.1 | 2 | 1.5 | 0. 28 | 2 |
| 7 | 2.2 | 0.28 | 2.2 | 1.2 | 0.40 | 2.2 |
| 8 | 3 | 1.1 | 3 | 3.3 | 1.39 | 3 |

The thickness of the image receiving sheets and the ink sheets were as follows:
Image-receiving sheet 1, fusion transfer type: 134 μm
Image-receiving sheet 2, sublimation transfer type: 120 μm
Ink sheet 1, fusion transfer type: 107 μm
Ink sheet 2, sublimation transfer type: 101 μm
<Sublimation transfer type image recording>

Example 1

An image recording apparatus shown in FIG. 2 was used, in which supporting drum 3 shown in Table 1 was installed. Image-receiving sheet 2 and Ink sheet 2 were superposed and held on the supporting drum by reduced pressure contacting using a vacuum pump. Five sets of a solid image and a wedge image were repeatedly recorded, and the recorded images were re-transferred on art paper of 127 g/m$^2$ by a laminator DX-700, manufactured by Tokyo Laminex Co., Ltd., to form final images. The vacuum degree at the interior of the supporting drum was 580 torr.

Example 2

An image recording apparatus shown in FIG. 2 was used, in which supporting drum 4 shown in Table 1 was installed. Image-receiving sheet 2 and Ink sheet 2 were superposed and held on the supporting drum by reduced pressure contacting using a blower. Image recording was carried out in the same manner as in Example 1. The vacuum degree at the interior of the supporting drum was 580 torr.

Example 3

An image recording apparatus shown in FIG. 2 was used, in which supporting drum 5 shown in Table 1 was installed. Image-receiving sheet 2 and Ink sheet 2 were superposed and held on the supporting drum by reduced pressure contacting using a vacuum pump. Image was carried out in the same manner as in Example 1. The vacuum degree at the interior of the supporting drum was 580 torr.

Example 4

An image recording apparatus shown in FIG. 2 was used, in which supporting drum 6 shown in Table 1 was installed. Image-receiving sheet 2 and Ink sheet 2 were superposed and held on the supporting drum by reduced pressure contacting using a vacuum pump. Image recording was carried out in the same manner as in Example 1. The vacuum degree at the interior of the supporting drum was 530 torr.

Comparative Example 5

An image recording apparatus shown in FIG. 2 was used, in which supporting drum 1 shown in Table 1 was installed. Image-receiving sheet 2 and Ink sheet 2 were superposed and held on the supporting drum by reduced pressure contacting using a vacuum pump. Image recording was carried out in the same manner as in Example 1. The vacuum degree at the interior of the supporting drum was 580 torr.
<Fusion transfer type image recording>

Example 6

Example 6 is an example of the fusion transfer type image recording. An image recording apparatus shown in FIG. 2 was used, in which supporting drum 4 shown in Table 1 was installed. Image-receiving sheet 1 and Ink sheet 1 were superposed and held on the supporting drum by reduced pressure contacting using a vacuum pump. Image recording was carried out in the same manner as in Example 1. The vacuum degree at the interior of the supporting drum was 580 torr.

Example 7

An image recording apparatus shown in FIG. 2 was used, in which supporting drum 7 shown in Table 1 was installed.

Image-receiving sheet 1 and Ink sheet 1 were superposed and held on the supporting drum by reduced pressure contacting using a blower. Image recording was carried out in the same manner as in Example 1. The vacuum degree at the interior of the supporting drum was 580 torr.

Comparative Example 8

An image recording apparatus shown in FIG. 2 was used, in which supporting drum 2 shown in Table 1 was installed. Image-receiving sheet 1 and Ink sheet 1 were superposed and held on the supporting drum by reduced pressure contacting using a vacuum pump. Image recording was carried out in the same manner as in Example 1. The vacuum degree at the interior of the supporting drum was 580 torr.

Comparative Example 9

An image recording apparatus shown in FIG. 2 was used, in which supporting drum 8 shown in Table 1 was installed. Image-receiving sheet 1 and Ink sheet 1 were superposed and held on the supporting drum by reduced pressure contacting using a blower. Image recording was carried out in the same manner as in Example 1. The vacuum degree at the interior of the supporting drum was 580 torr.

In all the above examples, rotation speed of the supporting drum was 800 rpm and the vacuum degree at the interior of the supporting drum was 580 torr. Thus obtained images were evaluated as follows.

<Evaluation>

Sheet holding ability

A The sheets were held during exposure

B The sheets were not held during exposure

Mark of sucking hole

Marks caused by the sucking holes of the supporting drum formed on the solid image area of the obtained image were evaluated by visual observation.

A No mark was observed.

B Marks were slightly formed but it almost could not perceived.

C Marks were observed in full area.

Reproducibility of dot gain

The dot gain in 50% dot image of the wedge image was measured by a reflection densitometer Gretag D-186.

A Fluctuation range of the dot gain of the five images was within 1%.

B Fluctuation range of the dot gain of the five images was within 2%.

C Fluctuation range of the dot gain of the five images was more than 2%.

Thus obtained results are shown in Table 2.

TABLE 2

| Experiment No. | Drum No. | Ink sheet | Image receiving sheet | Sheet holding ability | Sucking hole mark | Dot gain reproducibility |
|---|---|---|---|---|---|---|
| 1(e) | 3 | 2 | 2 | A | A | B |
| 2(e) | 4 | 2 | 2 | A | A | A |
| 3(e) | 5 | 2 | 2 | A | A | B |
| 4(e) | 6 | 2 | 2 | A | A | B |
| 5(c) | 1 | 2 | 2 | B | — | — |
| 6(e) | 4 | 1 | 1 | A | A | A |
| 7(e) | 7 | 1 | 1 | A | B | |
| 8(c) | 2 | 1 | 1 | B | — | — |
| 9(c) | 8 | 1 | 1 | A | C | B |

(e): Example
(c): Comparative example

As is shown in Table 2, formation of the mark caused by the sucking hole is within the degree of not influence on the image, and good dot gain reproducibility and sheet holding ability can be obtained when the image-receiving sheet having the total thickness of from 50 to 170 μm is held on the recording apparatus according to the invention for carrying out image recording.

The above-disclosed embodiments can be varied by a skilled person without departing from the spirit and scope of the invention.

What is claimed is:

1. A thermal transfer image forming method using a laser comprising the steps of placing an image-receiving sheet comprising a substratum and an image receiving layer, on a supporting drum having suction holes to be held thereon so that the surface of the image-receiving layer is faced outside, superposing an ink sheet comprising a substratum and an ink layer, on the image-receiving sheet held on the supporting drum so that the surface of the image receiving-layer contacts with the surface of the ink layer, imagewise irradiation laser light beam to the ink sheet held on the supporting drum which is rotated to transfer an image onto the surface of the image receiving layer, wherein during imagewise irradiation, the image-receiving sheet and the ink sheet are sucked through the suction holes of the supporting drum to be held thereon, the size of the ink sheet is larger than that of the image receiving sheet in both of longitudinal and lateral directions, the diameters of not less than 95% in number of the suction holes provided in an area covered by the image-receiving sheet are each within a range of from 0.4 mm to 2.5 mm, the opening ratio of the suction holes in the area covered by the image-receiving sheet is not less than 0.1%, the degree of the reduced pressure in the inside of the supporting drum is within a range of from 150 torr to 640 torr, the circumferential length of the supporting drum is not less than 600 mm, and the thickness of the image-receiving sheet is within a range of from 50 μm to 170 μm.

2. The thermal transfer image forming method using a laser of claim 1, wherein the diameters of all suction holes provided in the area covered by the image-receiving sheet are each within a range of from 0.4 mm to 2.5 mm.

3. The thermal transfer image forming method using a laser of claim 1, wherein the diameters of not less than 95% in number of the suction holes provided in an area covered by the image-receiving sheet are each within a range of from 0.4 mm to 1.5 mm.

4. The thermal transfer image forming method using a laser of claim 1, wherein the opening ratio of the suction holes in the area covered by the image-receiving sheet other than an effective image forming area is not less than 0.3%.

5. The thermal transfer image forming method using a laser of claim 1, wherein the diameter of the suction hole in an area covered by the image receiving sheet and in an effective image forming area is within a range of from 0.4 mm to 1.0 mm.

6. The thermal transfer image forming method using a laser of claim 1, wherein the opening ratio of the suction holes in the area covered by the image-receiving sheet is within a range of from 0.1% to 0.5%.

7. The thermal transfer image forming method using a laser of claim 1, wherein the circumferential length of the supporting drum is within a range of from 600 mm to 1250 mm.

* * * * *